US005469508A

United States Patent [19]

Vallier

[11] Patent Number: 5,469,508

[45] Date of Patent: Nov. 21, 1995

[54] AUDIO SIGNAL PROCESSOR

[75] Inventor: Jeffrey J. Vallier, Ames, Iowa

[73] Assignee: Iowa State University Research Foundation, Inc., Ames, Iowa

[21] Appl. No.: 131,780

[22] Filed: Oct. 4, 1993

[51] Int. Cl.[6] .......... H03G 3/00

[52] U.S. Cl. .......... 381/63; 84/604

[58] Field of Search .......... 84/603, 604, 605; 381/63, 61, 98

[56] References Cited

U.S. PATENT DOCUMENTS

| | | | |
|---|---|---|---|
| 3,749,837 | 7/1973 | Doughty . | |
| 4,000,676 | 1/1977 | Love | 84/1.25 |
| 4,428,270 | 1/1984 | Ippolito | 84/1.24 |
| 4,570,523 | 2/1986 | Futamase et al. | 84/1.24 |
| 4,628,789 | 12/1986 | Fujimori | 84/1.24 |
| 4,864,625 | 9/1989 | Hanzawa et al. | 381/61 |
| 4,933,980 | 6/1990 | Thompson | 381/61 |
| 4,937,875 | 6/1990 | Hayashi | 381/63 |
| 4,991,218 | 2/1991 | Kramer | 381/61 |
| 5,040,220 | 8/1991 | Iwamatsu | 381/63 |
| 5,065,432 | 11/1991 | Sasaki et al. | 381/61 |
| 5,136,912 | 8/1992 | Morikawa et al. | 84/603 |

OTHER PUBLICATIONS

Hartmann, *Flanging and Phasers,* Journal of the Audio Engineering Society, Jun. 1978, vol. 26, No. 6.

Biegel, *A Digital "Phase Shifter" for Musical Applications, Using the Bell Labs (Alles–Fischer) Digital Filter Module,* Journal of the Audio Engineering Society, 1979 Sep., vol. 27, No. 9.

*Primary Examiner*—Forester W. Isen

*Attorney, Agent, or Firm*—Leydig, Voit & Mayer, Ltd.

[57] ABSTRACT

An audio signal processor capable of both sampling and audio processing external audio signals is disclosed. The audio signal processor can sample an audio signal and store it in a fixed store in a two function memory for later playback or manipulation. The processor can also audio process external signals in real time by splitting an incoming signal into two parts; processing one part such that it is time delayed and/or pitch shifted, or both, with respect to the unaltered part; and recombining the processed part and the unaltered part to achieve time delay effects such as flanging, chorus and echo. Moreover, the audio signal processor can output samples from the fixed store and real time processed signals simultaneously to achieve complex sound combinations and auditory effects.

23 Claims, 4 Drawing Sheets

AUDIO SIGNAL PROCESSOR

FIELD OF THE INVENTION

This invention relates generally to an audio signal processor for manipulating audio signals and more particularly to an audio signal processor capable of performing both audio processing and sampling functions.

BACKGROUND OF THE INVENTION

Electronic devices have attained a singularly important position in the popular music industry. Not only are various electronic devices used to record and playback the industry's main product, but electronics are frequently being used to create new sounds and new forms of music that could not easily be achieved without electronic assistance. For instance, the entire rap music genre is based on the concept of sampling a short segment of music and playing it back repeatedly to create a song. Electronic devices called "Samplers" are exceptionally well suited for use in this musical approach. Samplers are electronic devices which can sample and store short segments of old songs or sounds—samples—for indefinite periods of time. The samples can then be modified, combined and/or played back to create an "entirely new" song at the composer's leisure. While this same effect can be accomplished by a live musician repeating a few notes over and over again, this sort of repetitiveness is most easily accomplished through the use of electronic circuitry.

Furthermore, a wide range of electronic devices have been developed to perform real time modifications of audio signals. These electronic devices—audio processors—have often been designed to either imitate special auditory effects or to achieve new sounds that could not easily be attained without electronic assistance. For example, in the 1960's, one of the Beatles, John Lennon, discovered that he could obtain a distinctive sound by distorting the sound of a tape played on a reel-to-reel tape deck. He achieved his effect by pressing on the flange of one of the tape player's reels to retard the tape's progress. This musical technique called "flanging" spurred several designers into developing methods of electronically imitating the effect. While these designers were able to achieve some success in imitating the flanging sound by using special mathematical algorithms, the resulting imitations were less than perfect reproductions of the effect. In short, the prior art has failed to produce an audio processor that provides satisfactory flanging effects.

Despite the ever expanding role of electronic devices for use in the music industry, the prior art has also failed to develop an audio signal processor with both audio processing and sampling capabilities. Although there are samplers that can perform rudimentary processing of their stored samples, these samplers are incapable of processing external signals in real time. Thus, the prior art only offers devices that perform strictly audio processing functions or strictly sampling functions. As a result, composers are required to purchase discrete units to satisfy both their sampling and audio processing needs.

OBJECTS OF THE INVENTION

It is a general object of the invention to provide an audio signal processor capable of performing both audio processing and sampling functions. Accordingly, it is an object of the invention to provide an audio signal processor capable of performing both audio processing of audio signals in real time and sampling of audio signals for both playback and further processing at later times. It is a related object to provide a device capable of audio processing both its own samples and samples from other samplers. It is yet another related object of the invention to reduce the cost of the equipment required by a composer employing both real time processing and sampling by combining two previously separate devices into one integrated unit.

It is an additional object of the invention to provide an audio signal processor capable of producing a variety of time shifting effects including flanging, chorus and echo effects. It is a related object to provide a device which can achieve flanging or chorusing without relying upon a mathematical algorithm to approximate the effect.

SUMMARY OF THE INVENTION

The present invention accomplishes these objectives and overcomes the drawbacks of the prior art by forsaking the simulations created by the mathematical algorithms of the prior art and instead, combining analog and digital techniques to achieve time delay effects. More specifically, the present invention uses analog modulation of a digital clock operated asynchronously with the system clock to vary the rate at which an analog to digital converter (ADC) converts audio signals into digital signals and then uses a digital to analog converter (DAC) operating at a fixed rate to return the signal to the analog world. The difference in the rates of the ADC and the DAC causes the DAC's output to have a different pitch than the original audio signal. According to an important aspect of the invention, the audio signal processor can also temporarily store the output of the ADC in a memory to delay the signals in time with respect to the signals originally received by the system. Moreover, the audio signal processor can also combine the time delay and pitch shift effects to achieve either a flanging or chorus effect (depending on the length of the delay). Thus, the present invention is able to produce time shifting effects—flanging, chorusing, pure delay or pure pitch shifting—without employing algorithmic simulations and thereby avoids the limitations of the mathematical approximations of the prior art.

Further, the present invention employs a microprocessor operating within control parameters set through a user interface to both sample and process audio signals. Thus, the microprocessor can control the behavior of the system's input, output and memory circuitry to perform either the time shifting audio processing techniques outlined above or to function as a sampler. Thus, the microprocessor enables the device to use substantially the same components to perform the separate functions of sampling and audio processing.

In the sampler mode, the microprocessor commands the ADC to convert the incoming audio signals into digital signals at a fixed rate. The microprocessor then places the sample in the fixed store portion of a two function memory until further instructed by the user. The samples are selectively stored and addressed such that they can be read out at any time for playback, further processing or whatever else the user desires.

In contrast, when operating as an audio processor, the system first receives an audio input signal and splits it into a processed part and an unaltered part. Depending on the parameters set by the user, the microprocessor will then command the components of the system to effect a time delay, pitch shift or both a time delay and a pitch shift of the processed signal. Should the user set parameters to both pitch shift and time delay the signal, the microprocessor will modulate the digital clock that drives the ADC with a continuously varying signal. This modulation will cause the ADC to sample the processed part of the audio input signal at a correspondingly varying rate. The microprocessor will then place the digital signal output by the ADC converter into a circulating store portion of the two function memory where it will be briefly retained. After the passage of a short time set by the microprocessor, the digital signal will be read out of the circulating store and converted by a DAC operating at a fixed rate into an analog output signal. This analog output signal will then be mixed with the unaltered part of the audio input signal to achieve a flanging or chorus effect. The difference in the rates of the ADC and DAC converters will result in a shift in the pitch of the processed part of the audio input signal relative to the unaltered part. The brief stay in the circulating store combined with the time it takes to pass through the system will also delay the processed part of the signal with respect to the unaltered part. These two modifications, pitch shifting and time delaying, combine to achieve the time shift effects of chorusing or flanging.

If the user desires, the audio signal processor can also effect a time delay without a pitch shift of an audio signal or vice versa. In the first instance (pure time delay), the ADC clock will not trigger the ADC. Instead the microprocessor will provide the ADC with a trigger signal based on the system clock. This trigger signal will oscillate at a fixed frequency and the ADC will sample the audio input signal at a correspondingly fixed rate. Preferably, this rate will be identical to the DAC rate to prevent any pitch shifts. Thus, after the microprocessor runs the ADC's output through the circulating store and the DAC reconverts the sample into a digital signal, the processed part will have been time delayed but not pitch shifted with respect to the original audio input signal. Similarly, the processed signal can be pitch shifted with minimal delay by modulating the ADC sampling rate and then running the converted signal through the DAC without writing it to the circulating store or with only minimal delay in the circulating store.

Not only is the audio signal processor capable of sampling signals for later manipulations and processing external signals in real time, but it can also audio process its previously sampled signals. In other words, the device can impart time delay effects to its own samples by virtue of a digitally activated feedback circuit for returning the samples to the input of the device for processing. In order to process its samples, the microprocessor will cause a selected sample or sequence of samples to be read out from the fixed store of the two function memory and converted to an analog output signal through the DAC. It will then activate a switch that enables a feedback path causing the analog output signal to be returned to the input of the device. The entire audio processing procedure will then be performed on the signal from splitting to recombining.

These and other features and advantages of the invention will be more readily apparent upon reading the following description of the preferred embodiment of the invention and upon reference to the accompanying drawings wherein:

DESCRIPTION OF A PREFERRED EMBODIMENT

Figure 1:
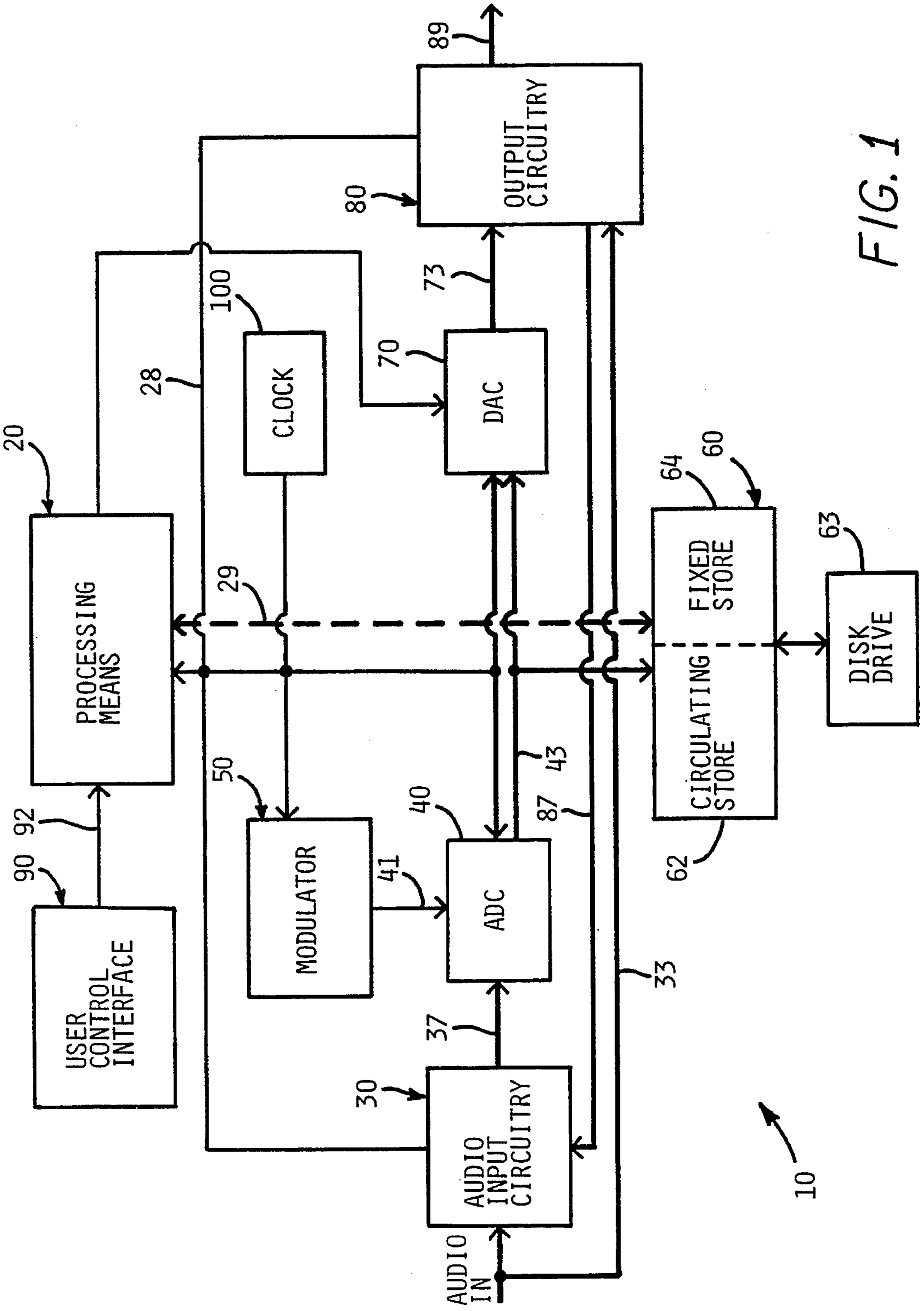
FIG. 1 is a block diagram representation of an audio signal processor constructed in accordance with the present invention.

FIG. 1 shows generally a block diagram representation of an audio signal processor 10 constructed in accordance with the teachings of the invention. The audio signal processor 10 is equipped to perform several functions. Its two primary functions are 1) to audio process external signals in real time to achieve time delay effects including pure pitch shifting with negligible time delays; and 2) to sample and/or store segments of external audio signals for future playback and/or manipulation. The audio signal processor 10 has a related sub-function of audio processing its sampled signals which, in effect entails performing both primary functions described above—sampling and then audio processing a sample.

As can be seen in FIG. 1, the audio signal processor 10 comprises a processing means 20, audio input circuitry 30, an analog to digital converter (ADC) 40 with an associated modulator 50, a two function memory 60, a digital to analog converter (DAC) 70 and output circuitry 80 all interactively connected to perform the functions outlined above. In both the audio processing mode and the sampling mode, the device 10 receives audio input signals through the audio input circuitry 30. This audio input signal is processed by the analog input 30 and output to both the ADC 40 and the output circuitry 80. Thus, the audio input circuitry 30 preferably splits the audio input signal into two signals, a processed signal and an unaltered signal. "Unaltered" in this context means only that the time and pitch shifting are not applied. The unaltered signal can, of course, be filtered or otherwise processed so long as its phase and pitch remain substantially like that of the input signal for later recombination with the digitally shifted sample.

When operating in the audio processing mode, the audio signal processor 10 is capable of pitch shifting and/or time delaying the processed signal with respect to the unaltered signal to achieve time delay effects. In order to pitch shift the processed signal, the modulator 50 modulates the ADC rate with a continuously varying analog signal in accordance with the commands of the processing means 20 thereby causing the ADC 40 to sample and digitize the audio input signals at a correspondingly varying rate. These samples are then reconverted into analog signals by the DAC 70 operating at a fixed rate. The difference between the rates of the ADC 40 and the DAC 70 results in a pitch shift of the processed signal with respect to the unaltered signal.

On the other hand, to achieve a pure time delay (no pitch shift), the processing means 20 the ADC 40 and the DAC 70 operate at the same rate. Thus, the processed signal is not pitch shifted. However, in this mode of operation, the digitized samples from the ADC 40 are temporarily stored in the two function memory 60 before the DAC 70 reconverts them to analog signals. The time spent in the memory 60 delays the processed signal with respect to the unaltered signal such that recombining the two signals results in an echo effect. In accordance with an important aspect of the invention, these two effects, pitch shifting and time delaying, can be imparted to the same processed signal at the same time to achieve flanging or chorusing effects.

It bears emphasis that when operating in the audio processor mode, the ADC 40 is triggered by a clock 56 which operates totally independently of the system clock 100. Thus, the sampling of audio signals by the ADC 40 is asynchronous with the system clock 100. Consequently, the analog modulation of the audio input signal used to achieve shifts in pitch is also completely asynchronous with the rest of the system functions. The result is improved sound quality as explained below.

In contrast to this asynchronous operation, when the audio signal processor 10 is operating in the sampling mode, the ADC 40 is triggered by an onboard timer (not shown) in the microprocessor 22. Since the timing of the onboard timer is preferably based on the system clock 100, the ADC 40 operates synchronously with the system clock 100. Basing ADC operation in the sampling mode on the system clock 100 improves the accuracy of the system and insures the ADC 40 will operate at the same rate as the DAC 70 thereby avoiding unwanted pitch shifts. It also simplifies transfers of samples from other devices to the audio signal processor 10.

Thus, when the audio signal processor 10 is operating as a sampler, the microprocessor 22 will provide the ADC 40 with a control signal to initiate sampling of the audio input signal. The ADC 40 then converts the processed signal into a sequence of digital words forming a sample at a fixed rate and outputs the sample into the two function memory 60 where it will be stored indefinitely. The sampling process is then complete. However, the audio signal processor 10 is also able to process these samples at a later time by outputting them without processing through the DAC 70 and returning the samples through the output circuitry 80 to the audio input circuitry 30 to begin the audio processing sequence. It is also contemplated that samples for later playback can be provided to the memory 60 by means other than the ADC 40. The disk drive 63 which is connected to the memory 60 through a standard S.C.S.I. interface exemplifies such additional source of digital samples.

It will be noted by those skilled in the art, that by controlling the variation between the ADC and DAC rates and the length of time spent in the memory 60, the processing means 20 precisely controls both the amount of pitch shift and the degree of delay the processed signal incurs. Thus, the processing means 20 controls the overall effect of the device 10. Indeed, the type of time shifting effect achieved by the audio signal processor 10 depends upon the length of the delay and the degree of pitch shift the processing means 20 imparts to the processed signal. For example, time delays on the order of 9 milliseconds to 6 seconds with no shift in pitch will result in echoes, whereas pitch shifting combined with time delays on the order of 1–4 milliseconds and 4–9 milliseconds result in flanging and chorusing, respectively.

It will further be noted that the audio signal processor 10, unlike the prior art, achieves time shifting effects without employing mathematical simulations or approximations. As a result, the output of the audio signal processor 10 will not suffer from the audible imperfections of signals processed by the prior art simulation techniques. Thus, the audio signal processor 10 achieves a markedly better audio processing result than the digital simulations of the past while providing a highly versatile device that can also function as a sampler.

Furthermore, because the modulator 50 which controls pitch shifting is an analog device and thus provides continuously variable pitch shifting and because this analog modulation is asynchronous with the system clock 100, the audible effect is far superior to that achievable with digital shifts in the ADC sampling rate. Indeed, the asynchronous analog modulation technique achieves pitch shifting in a truly continuous manner which is analogous to the hand flanging of tape decks initially performed by John Lennon. Digital shifts in the ADC sampling rate would result in discrete, non-continuous steps which could cause jumping in pitch shifting which would not be seen in Lennon's manual approach or the analog modulation technique of the present invention. Further, if the ADC 40 was clocked synchronously with the system clock 100 during modulation a noticeable quantized effect might be imparted to the audio signals. This quantized effect could result in stepped changes in pitch rather than continuous pitch shifting. Because the analog modulation is performed asynchronously of the system clock 100, no such audible defects in the audio signals output by the audio signal processor 10 will occur. Thus, asynchronous analog modulation of the audio signals results in a more "natural" flanging sound.

Because of the dual nature of the audio signal processor 10—audio processor and sampler—and because the device 10 uses substantially the same components to perform these highly distinct functions, the audio signal processor's processing means 20 plays a central role in the device 10. The processing means 20 directs the flow of data within the audio signal processor 10 and causes the various components to operate in accordance with the function being performed. To this end, the processing means 20 controls virtually every component of the audio signal processor 10. In the illustrated embodiment, such control is exercised by way of a control bus 28 as illustrated in FIG. 1. This control bus 28 carries the commands of the processing means 20 to the various components directing them to perform their respective functions.

Figure 2:
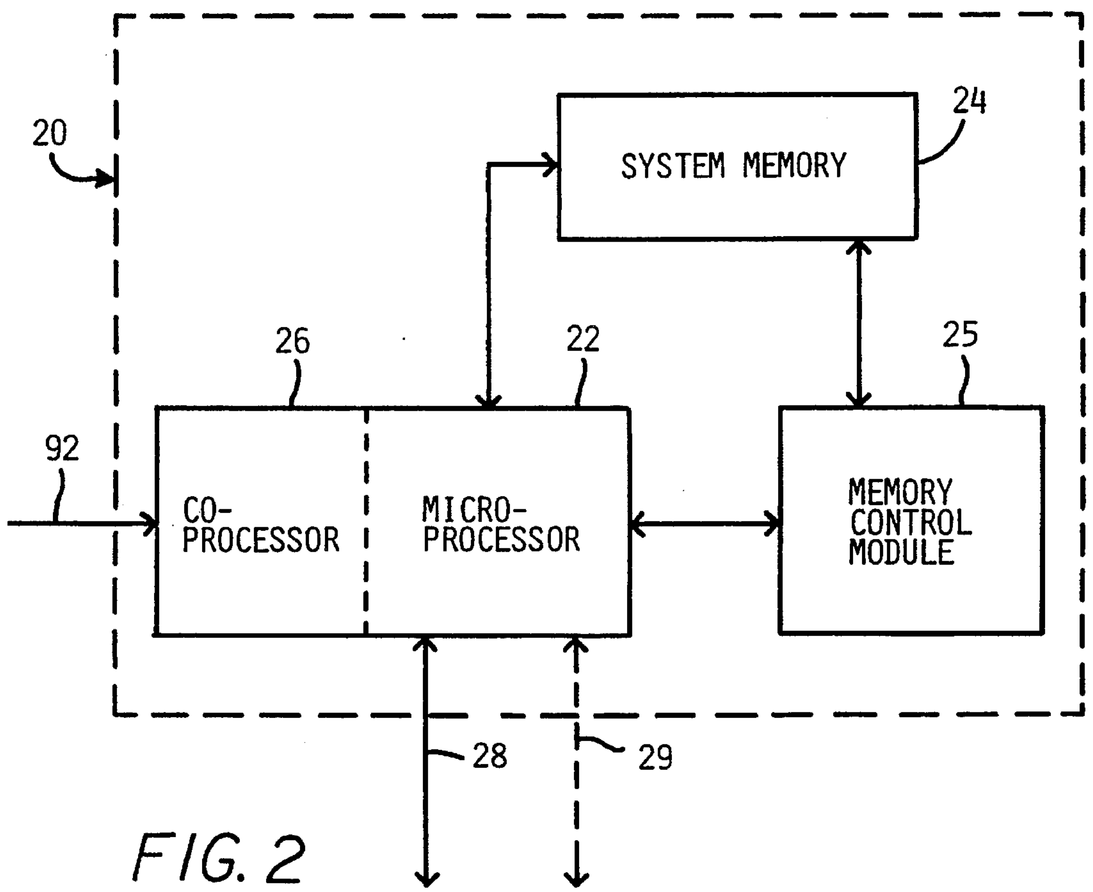
FIG. 2 is a block diagram representation of the processing means of FIG. 1.

As illustrated in FIG. 2, a preferred embodiment of the processing means 20 comprises a microprocessor 22, a system memory 24 and a co-processor 26. The microprocessor 22 is the operational heart of the processing means 20 and indeed, the audio signal processor 10. It generates the commands instructing the processor's components how and when to perform their functions and thereby controls the flow of data through the system. Preferably the microprocessor 22 comprises an Am29200 Streamlined Instruction Processor from Advanced Micro Devices operating at 16 megahertz. However, it will be appreciated by those skilled in the art that any commercially available microprocessor with performance characteristics comparable to the Am29200 could also be used.

The microprocessor 22 has an associated system memory 24 which contains the system program directing the microprocessor 22 how and when to perform. The system memory 24 is preferably an erasable programmable read only memory that stores the operational instructions which direct the microprocessor 22 in generating commands for performing the audio processing and sampling functions. Preferably the system memory 24 comprises four commercially available Am27HB010 128K×8 Burst-Mode EPROMS but it will be appreciated by those skilled in the art that any comparably EPROM device could be employed.

Although in the preferred embodiment the microprocessor 22 controls the operations of the two function memory 60 in accordance with its programmed instructions, it will be appreciated that this function could also be performed by hardware dedicated to memory control without departing from the spirit of the invention. Thus, if, for example, one chose to use a less sophisticated microprocessor 22 than the preferred Am29200 (such as Advanced Micro Devices Am29000) or simply wished to free the Am29200 for other tasks, one could include a memory control module 25 in the processing means 20 for controlling the read and write functions of both the system memory 24 and the two function memory 60 in accordance with instructions received from the microprocessor 22. With respect to the two function memory 60, the memory control module 25 would both cause the memory 60 to accept samples from the ADC 40 and to output samples to the DAC 70 when instructed to do so by the microprocessor 22 by sending commands over memory control lines 29. If this optional approach is taken, the memory control module 25 would preferably comprise a V29BMC Burst-mode Memory Controller. However, it will be appreciated by those skilled in the art, that any memory controller having operating characteristics similar to the V29BMC might also be acceptable in this optional role.

In another optional embodiment, the processing means 20 is equipped with a co-processor 26 as shown in FIG. 2. This co-processor 26 could be employed to perform the time-shifting simulations taught by the prior art such as pitch shifting and multi-reflection digital reverberation simulations. The inclusion of this co-processor 26 would make the audio signal processor 10 even more versatile by enabling it to perform some of the traditional time shifting simulations taught in the art. However, the inclusion of this co-processor 26 is purely optional as these prior art techniques are plainly inferior to the new techniques taught by the present invention. Should the co-processor 26 be included, it would preferably comprise an Am29050 Floating-Point processor which is commercially available from Advanced Micro Devices. However, it will be appreciated by those skilled in the art that any other commercially available DSP chip compatible with the microprocessor 24 could also be used.

Returning to FIG. 1, it can be seen that the processing means 20 is coupled to a user control interface 90. This user control interface 90 allows a user of the audio signal processor 10 to input control parameters which dictate how the device 10 will operate. For example, the user can employ the user control interface 90 to select whether the device 10 will function as a sampler or an audio processor. If the user directs the device 10 to audio process an external signal, he or she can set the amount of delay and the degree of pitch shift the audio signal processor 10 will impart to the audio input signal. Similarly, if the user decides to audio process a sample that the audio processor 10 has previously sampled and stored, he or she can make similar selections with respect to the delay and pitch shifting of the sample by virtue of the interface 90. Moreover, the user can employ the user interface 90 (or a keyboard or mouse connected thereto) to select any sample stored in the two function memory 60 and read it out through the DAC 70 at any time including simultaneously with the audio processed signals which are temporarily delayed in the memory 60.

The user control interface 90 preferably includes a 4×5 matrix of ITT Schadow Digitast series pushbutton switches debounced by 74279 S-R latches which is connected to a data bus 92 connecting the user control interface 90 to the microprocessor 24 via a 74LS245 bidirectional bus driver. However, it will be appreciated by those skilled in the art that any comparable user interface could also be employed.

Figure 3:
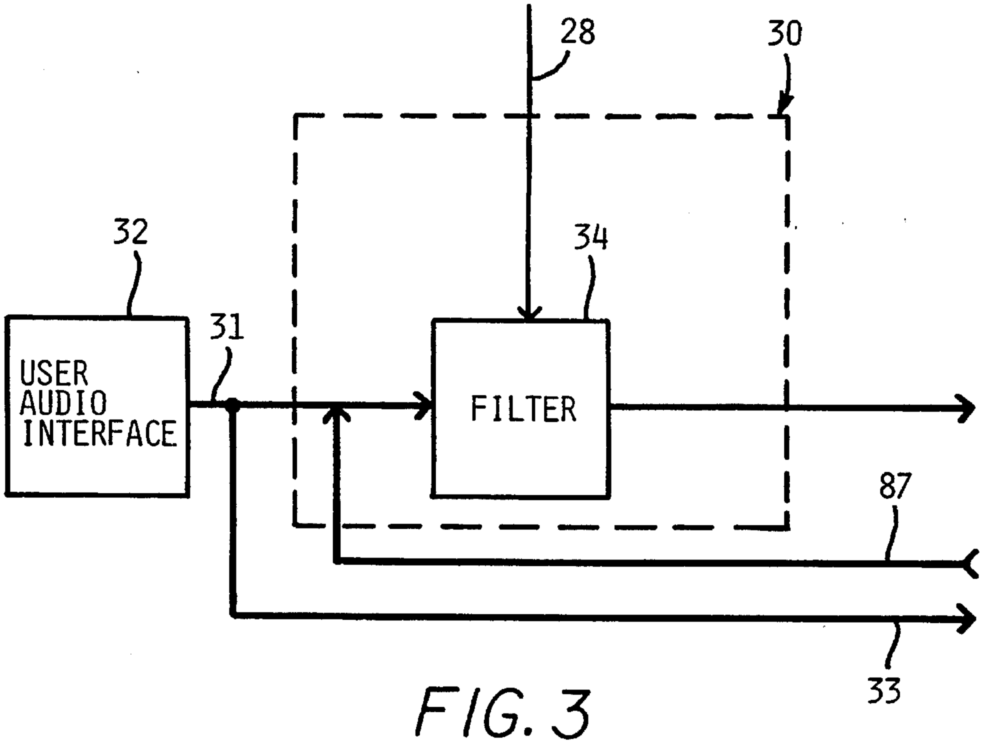
FIG. 3 is a block diagram representation of the audio input circuitry FIG. 1.

As previously mentioned, the audio signal processor 10 is provided with audio input circuitry 30 for inputting audio signals into the device 10. As illustrated in FIG. 3, this analog input 30 comprises a user audio interface 32 and a filter 34. The user audio interface 32 can comprise virtually any means of supplying audio signals. Thus, a user can input audio input signals by connecting a musical instrument, a microphone or an electronic audio device such as a cd-player or tape deck to the user audio interface 32. In the preferred embodiment, the audio signal processor 10 fully complies with the Musical Instrument Digital Interface (MIDI) standard for serial communication between musical equipment. Thus, virtually all of the control parameters of the audio signal processor 10 can be controlled through external MIDI compatible equipment such as computers and other music processing equipment.

Interface 32 outputs the audio input signals to both the filter 34 over connection 31 and the output circuitry 80 over line 33. Thus, the unaltered signal described above is transmitted over line 33 to avoid any distortions while the processed signal is sent into the filter 34. After the processed signal is filtered, it is output to the ADC 40 over line 37 to be converted into a digital signal.

The filter 34 is preferably a Maxim 270 Digitally Programmable Dual Lowpass Filter connected to the processing means 20 by control bus 28 to enable the processing means 20 to program its cutoff frequencies. The use of a digitally programmable filter 34 such as the Maxim 270 enables the processing means 20 to control the frequency response of the audio signal processor 10. It should be noted that this cutoff frequency is another parameter that can be set by the user through the user control interface 90 described above. It should also be noted that while the device preferably employs the Maxim 270 filter described above, any digitally programmable filter could be used in this role. Moreover, those skilled in the art will recognize that a non-programmable filter could also be used in the device 10 although this would naturally result in relinquishing this degree of control over the frequency response of the processor 10.

Figure 4:
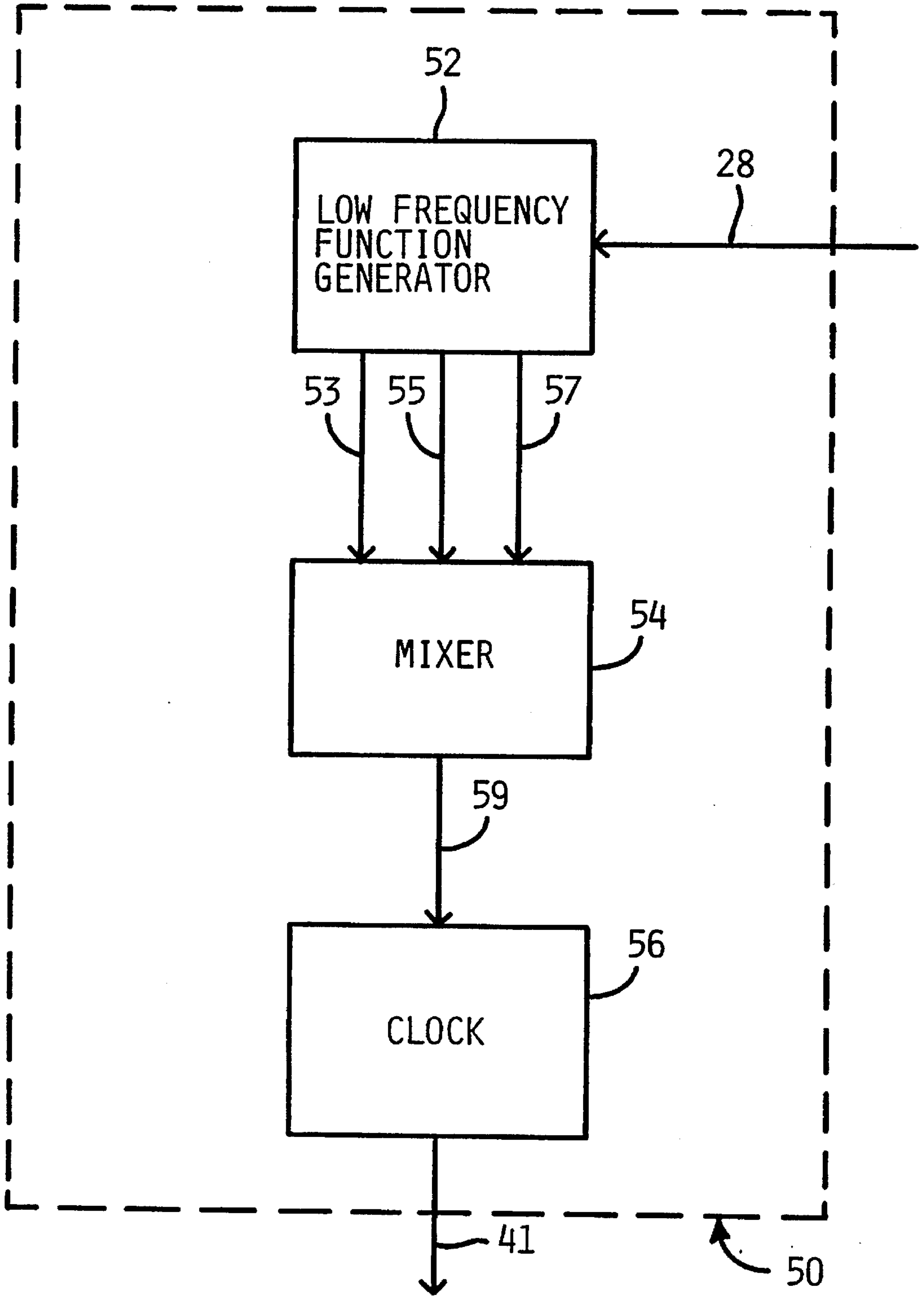
FIG. 4 is a block diagram representation of the modulator of FIG. 1; and, FIG. 5 is a block diagram representation of the output circuitry of FIG. 1.

As best seen in FIG. 1, the ADC 40 is connected to the modulator 50 by line 41. As previously mentioned, the modulator 50 serves to vary the rate at which the ADC 40 converts the processed signal into a digital signal. As illustrated in FIG. 4, the modulator 50 comprises a low frequency function generator 52, a mixer 54 and a clock 56.

In operation, the low frequency function generator 52 produces continuous wave sine, triangle, and random control voltage waveforms in combination or individually and outputs these waveforms over lines 53, 55 and 57 to the mixer 54. The mixer 54 combines the waveforms into one complex analog signal in accordance with commands received from the processing means 20. After the mixer 54 combines the waveforms into a single complex analog signal, it outputs the analog signal over line 59 to sweep the sample clock 56. This analog signal modulates the digital clock 56 whose output frequency is correspondingly varied. The clock signal is in turn output to the ADC 40 via line 41 which converts the processed signals on line 37 into digital signals output on data bus 43 at a rate corresponding to the clock signal.

It should be emphasized that the low frequency function generator 52 is connected to the processing means 20 via control bus 28 and it will generate signals in accordance with the commands of the processing means. Thus, the processing means 20 can command the modulator 50 to generate widely varying waveforms including no modulation whatsoever. This no-modulation waveform is typically a steady dc level applied to the clock's modulation input to operate the clock at a fixed frequency such that the ADC 40 operates at the same rate as the DAC 70. Thus, the processing means 20 can manipulate the waveforms generated by the low frequency function generator 52 to attain widely varying shifts in the pitch of the processed signal including no pitch shift as is desirable during both the sampling mode and the pure delay approach of the audio processing mode. Thus, although pure time delays are preferably accomplished by clocking the ADC 40 with a trigger signal generated by an onboard timer in the microprocessor 22 as explained above, pure time delays could also be achieved by causing the modulator 50 to generate the no-modulation waveform without departing from the spirit of the invention. It is nonetheless preferable to trigger the ADC 40 with a signal from the onboard timer of the microprocessor 22 to insure the ADC 40 and the DAC 70 operate at the same rate. It should also be noted that the shapes of the waveforms generated by the function generator 52 is yet another parameter that can be controlled through the user control interface 90.

Finally, it should be noted that the low frequency function generator 52, the mixer 54 and the clock 56 are standard commercially available products. Any commercially available chips that will perform the above described functions—i.e. function generating, mixing and clocking—could be employed. However, in the preferred embodiment, the clock 56 comprises an NE555 timer running in an astable mode at 44.1 KHz. The 555 timer is preferred because of its ability to have its frequency swept by an external control voltage in the range needed to achieve flanging, chorus and echo effects. Moreover, the 555 timer is also preferred because of its ability to respond to continuously variable waveforms and thus achieve audio effects which are superior to those achieved with digitally varied timers. It will, however, be appreciated by those skilled in the art that any other timer capable of oscillating in comparable frequency ranges and being varied by an external voltage source could also be used.

In addition, it should be noted that although any commercially available low frequency function generator 52 could be used in this role, the audio signal processor 10 preferably employs a Maxim MAX038 Function Generator and a selectively activated noisy NPN transistor configured with a simple R-C low pass filter to generate its modulation waveform. Further, in the preferred embodiment, the mixer 54 comprises Xicor EEpots.

After the ADC 40 converts a processed signal from line 37 into a digital signal for output onto data bus 43, it sends an interrupt signal to the processing means 20 over the control bus 28 informing it that a signal has been converted. The processing means 20 then sends instructions to the two function memory 60 over memory control bus 29 as to where to store the incoming digital signal.

As best seen in FIG. 1, the two function memory 60 is partitioned into two sections, a circulating store 62 and a fixed store 64. The circulating store 62 is used to temporarily store the digital signals during the audio processing mode in order to delay the processed signal with respect to the unaltered signal. The fixed store 64, on the other hand, is used to store samples for longer periods of time. It receives samples during the sampling mode or otherwise and stores them indefinitely.

When operating in the audio processing mode, the two function memory 60 will receive commands from the processing means 20 via memory control bus 29 indicating that a digital signal is being sent from the ADC 40 via data bus 43. Memory 60 will also receive commands indicating that the audio signal processor 10 is operating in the audio signal processing mode and, consequently, the memory is to temporarily store the incoming digital signal in the circulating store 62.

In accordance with an important aspect of the invention, the microprocessor 22 is preferably equipped with a looping register. This looping register is preferably initialized to a maximum value and is an address pointer for the circulating store 62. Thus, when the circulating store 62 receives the command from the processing means 20, it will read the digital signal stored at the address pointed to by the looping register, output the signal to the DAC 70 and write the digital signal it receives from the ADC 40 to that same address. The processing means 20 will then decrement the looping register by one. This process will be repeated every time the ADC 40 sends another interrupt signal to the processing means 20 until the looping register reaches zero. At that point, the processing means 20 will return the looping register to its maximum value. The decrementing process can then begin anew.

It will be appreciated that each succeeding time down the looping register will cause the preceding series of digital signals to be read out to the DAC 70. Thus, the length of time the processed signal is stored in the circulating store 62 depends upon the looping register's maximum value. In other words, any digital signal which is written to an address in the circulating store 62 will remain at that address until the looping register completes a "loop" and again points to its address. The looping register completes a loop by writing a signal to every address in the circulating store 62. Thus, the larger the maximum valve of the looping register, the longer the digital signals will be delayed in the circulating store 62. This maximum value can be set through the user control interface 90 to delay the samples up to 6 seconds.

It will, of course, be appreciated that the looping register could just as easily be initialized to a minimum value and then incremented from address to address in a looping fashion without departing from the spirit of the invention. Thus, it is immaterial whether the address pointer of the looping register "loops" by being incremented or decremented. Either approach results in the desired delay effect.

When operating in the sampling mode to store samples, the two function memory 60 will again receive commands via memory control bus 29 indicating that a sample is being sent from the ADC 40 via data bus 43. The sample will be received by the memory 60 and stored in the fixed store 64. The fixed store 64 is capable of storing multiple samples at any one time. Accordingly, the samples are stored under addresses in accordance with the commands received from the processing means 20 for later retrieval. These samples will be stored until the processing means 20 commands the fixed store to output them to the DAC 70.

More specifically, in the preferred embodiment samples are stored in blocks of related information. In addition to the actual digitized audio signal, these blocks can include information on the playback rate, sample length, amplitude envelope and other parameters. These parameters can be edited by the user through the user control interface 90.

In the write operation, the user defines the parameters to be included in the sample block and initiates recording. The processing means 20 then loads samples into successive addresses in the fixed store 64 for the duration of the recording period. In the read operation, the processing means 20 uses an address pointer to read out the samples stored at the successive addresses. The samples are thus read to the DAC 70 to be converted back to analog signals.

It should be noted that whereas the circulating store 62 preferably reads and writes digital signals when the ADC 40 generates an interrupt signal, the fixed store 64 preferably reads and writes samples in accordance with the timing of an onboard timer (not shown) included in the microprocessor 22. This timer is clocked by the system clock 100.

Significantly, the two function memory 60 will be partitioned according to the maximum delay the audio signal processor 10 will impart to the processed signals. Specifically, the circulating store 62 must comprise a sufficiently large segment of the two function memory 60 to be able to store samples of the audio input signals equal to the maximum delay. In other words, if the audio signal processor 10 is designed to provide a maximum delay of 6 seconds (as is preferable), then the circulating store 62 must be capable of storing samples covering 6 seconds of the audio input signals to avoid loss of information. The remainder of the two function memory 60 can be dedicated to the fixed store 64.

Moreover, it will be appreciated by those skilled in the art that the two function memory 60 is volatile. Consequently, a loss of power, whether intentional or accidental, will result in the loss of any samples stored in the memory 60. Since it is sometimes desirable to retain the samples stored in the fixed store 64 in a more permanent fashion, the audio signal processor 10 is equipped with a hard disk drive 63 which can download or upload samples as needed through an S.C.S.I. interface. Thus, the audio signal processor 10 is capable of storing samples permanently. It will be noted that although the disk drive 63 has been described as a hard disk drive, a floppy disk drive could also be used.

The DAC 70 is a standard commercially available device which converts the digital signals output by the memory 60 into analog output signals. The DAC 70 always operates at the same constant rate. This is preferably the rate set by the processing means 20 through its onboard timer, but the system clock 100 or some other separate clocking device could also be employed in this role. In any event, the DAC functions precisely the same whether the device 10 is operating in a sampling mode or in an audio processing mode. It receives digital signals via data bus 43 and outputs analog output signals to the output circuitry 80 via connection 73.

Figure 5:
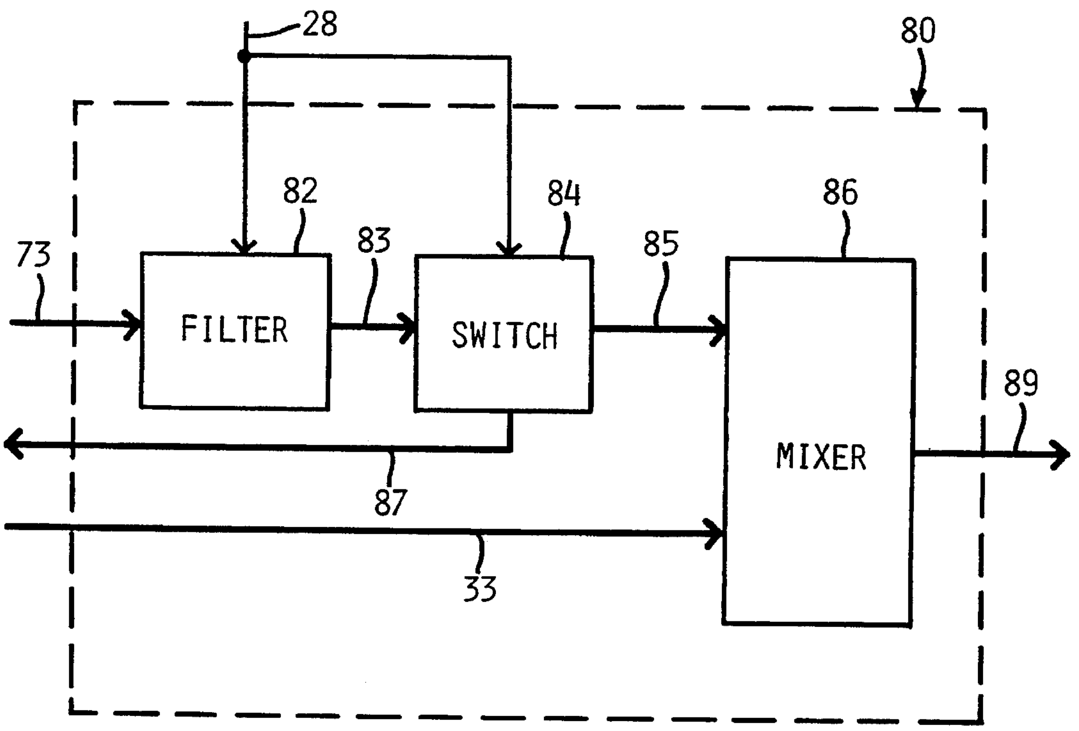

As illustrated in FIG. 5, the output means 80 comprises a low pass filter 82, a digitally controllable switch 84 and a mixer 86 which interact to achieve different effects depending on the audio signal processor's mode of operation. In the audio signal processing mode, the low pass filter 82 receives the analog output signal from the DAC 70 and outputs a filtered analog output signal to the digitally controllable switch 84 via connection 83. The switch 84 simply passes the filtered analog output signal from the filter 82 to the mixer 86 via lines 83 and 85. The mixer 86 combines it with the unaltered signal received from the audio input circuitry via connection 33 to achieve time shifting effects. The mixer 86 then outputs the audio signal processor's final output via connection 89.

When the device 10 is operating in the sampling mode, the output circuitry 80 operates to achieve two different effects. Switch 84, which is connected to the processing means 20 via control bus 28, operates to transfer samples down two distinct paths depending on the effect the user wishes. When the audio processor 10 seeks to output a sample from the fixed store 64, the switch 84 remains in its default state and simply passes the signals received from the filter 82 to the mixer 86. However, when the processor 10 seeks to audio process its samples, switch 84 is activated by the processing means 20. The switch 84 then diverts the signals output by the filter 82 to the audio input circuitry 30 via line 87. The audio input circuitry 30 will then split the sample into two parts—a processed part and an unaltered part—and begin the audio processing process described above. The switch 84 will then return to its default state so that the processed part of the sample will be passed to the mixer 86 for recombining with the unaltered part. Thus, the digitally controlled switch 84 combines with line 87 to form a digitally controlled feed back means which enables the audio processing of the audio processor's own samples.

It should be pointed out that the filter 82 of the output means 80 is preferably a Maxim 270 Digitally Controllable Filter connected to the processing means 20 via control bus 28. Thus, as in the low pass filter 34 described in the input circuitry 30, the cut off frequencies of the filter 82 are programmable by the processing means 20. Further, although other commercially available mixers might also be appropriate, the ICS2101 digitally controlled line mixer sold by Integrated Circuit Systems is presently preferred.

In summary, the present invention is a new and useful audio signal processor 10 having both audio processing and sampling capabilities. The audio signal processor can both sample incoming audio signals for future use—playback or processing—and process external signals in real time to achieve time delay effects such as flanging, chorus and echo. Moreover, the device can operate simultaneously as an audio processor and a sampler, outputting both samples and real time processed signals at the same time to achieve a great variety of auditory effects.

We claim:

1. A combined audio processor and sampler comprising:

an analog input for receiving audio input signals to be processed;

an analog-to-digital converter (ADC) for digitizing the audio input signals received from the analog input into samples;

a two function memory for receiving the samples from the ADC having:

- a circulating store having a plurality of sequential locations for temporarily delaying the samples a predetermined amount, and
- a fixed store having independently addressable locations for storing the samples for playback;
- a digital-to-analog converter (DAC) for receiving the samples from the two function memory and converting them to analog output signals;

a processing means for controlling manipulation of the samples, the processing means controlling the predetermined amount of delay imparted by the circulating store and selectively addressing the independently addressable locations in the fixed store; and, output means under the control of the processing means for selectively combining the audio input signals and the output of the DAC into a final output signal to achieve time delay effects.

2. A combined audio processor and sampler as defined in claim 1 wherein the processing means includes a microprocessor and a memory control module responsive to the microprocessor for controlling the two function memory.

3. A combined audio processor and sampler as defined in claim 1 wherein the audio input comprises:

an audio user interface for providing the audio input signals; and, a digitally controlled low pass filter for filtering the audio input signals received from the audio user interface and outputting the filtered signals to the ADC wherein the digitally controlled low pass filter has a cut off frequency set by the processing means.

4. A combined audio processor and sampler as defined in claim 1 wherein the output means comprises:

a digitally controlled mixer coupled to the DAC and to the analog input for selectively combining the analog output signals received from the DAC with the audio input signals received from the audio input wherein the analog output signals have been time delayed with respect to the audio input signals to achieve time delay effects.

5. A combined audio processor and sampler as defined in claim 4 wherein the output means further comprises:

a digitally controlled low pass output filter for filtering the analog output signals received from the DAC and outputting the filtered signals to the digitally controlled mixer for selective combining with the audio input signals wherein the digitally controlled low pass filter has a cut off frequency set by the processing means.

6. A combined audio processor and sampler as defined in claim 4 further comprising:

a digitally activated feedback means coupled between the DAC and the mixer which selectively returns samples read out of the fixed store to the input means for audio processing.

7. A combined audio processor and sampler as defined in claim 6 wherein the digitally activated feedback means comprises:

a digitally activated switch connected between the DAC and the mixer; and, a feedback circuit connected between the digital switch and the audio input wherein the digital switch outputs the analog output signals received from the DAC to the audio input through the feedback circuit in one state and to the mixer in another state.

8. A combined audio processor and sampler as defined in claim 1 further comprising:

a selectively activated sample clock associated with the ADC and operating asynchronously with respect to a system clock for setting the ADC rate independently of the system clock; and, a digitally controllable modulation means for selectively modulating the sample clock to achieve pitch shifting of the audio input signals.

9. A combined audio processor and sampler as defined in claim 8 wherein the digitally controllable modulation means comprises:

a variable waveform generator coupled to the processing means for generating variable waveforms which sweep the sample clock associated with the ADC thereby causing the sample clock to vary the ADC rate wherein differences between the ADC rate and the rate at which the DAC converts the samples received from the memory into the analog output signals shifts the pitch of the analog output signals relative to the audio input signals.

10. An audio processor for imparting time delay effects to audio signals comprising:

an analog input for receiving audio input signals to be processed;

an analog-to-digital converter (ADC) for digitizing the audio input signals received from the analog input into samples at an ADC rate;

processing means for controlling manipulation of the samples;

a sample clock associated with the ADC for setting the ADC rate;

digitally controllable modulation means for selectively producing a plurality of continuous modulation waveforms in accordance with commands received from the processing means and coupled to the sample clock for modulation thereof;

a memory for receiving samples from the ADC having a circulating store having a plurality of sequential locations for temporarily delaying the samples a predetermined amount in accordance with commands received from the processing means;

a digital-to-analog converter (DAC) for receiving the samples from the memory and converting them to analog output signals; and, output means under the control of the processing means for selectively combining the audio input signals and the output of the DAC to achieve time delay effects.

11. An audio processor for imparting time delay effects to audio signals as defined in claim 10 wherein the processing means includes a microprocessor and a memory control module responsive to the microprocessor for controlling the two function memory.

12. An audio processor for imparting time delay effects to audio signals as defined in claim 10 wherein the digitally controllable modulation means comprises:

a variable waveform generator coupled to the processing means for generating variable waveforms which sweep the sample clock associated with the ADC thereby causing the sample clock to vary the ADC rate wherein differences between the ADC rate and the rate at which the DAC converts the samples received from the memory into the analog output signals shifts the pitch of the analog output signals relative to the audio input signals.

13. An audio processor for imparting time delay effects to audio signals as defined in claim 10 wherein the audio input comprises:

an audio user interface for providing the audio input signals; and, a digitally controlled low pass filter for filtering the audio input signals received from the audio user interface and outputting the filtered signals to the ADC wherein the digitally controlled low pass filter has a cut off frequency set by the processing means.

14. An audio processor for imparting time delay effects to audio signals as defined in claim 10 wherein the output means comprises:

a digitally controlled mixer coupled to the DAC and to the analog input for selectively combining the analog output signals received from the DAC with the audio input signals received from the audio input wherein the analog output signals can be time delayed and pitch shifted with respect to the audio input signal to achieve time delay effects.

15. An audio processor for imparting time delay effects to audio signals as defined in claim 14 wherein the output means further comprises:

a digitally controlled low pass output filter for filtering the analog output signals received from the DAC and outputting the filtered signals to the digitally controlled mixer for selective combining with the audio input signals wherein the digitally controlled low pass filter has a cut off frequency set by the processing means.

16. A combined audio processor and sampler comprising:

an analog input for receiving audio input signals to be processed;

an analog-to-digital converter (ADC) for digitizing the audio input signals received from the analog input into samples at an ADC rate;

processing means for controlling manipulation of the samples;

a sample clock associated with the ADC for setting the ADC rate;

digitally controllable modulation means for selectively producing a plurality of continuous modulation waveforms in accordance with commands received from the processing means and coupled to the sample clock for modulation thereof;

a two function memory for receiving samples from the ADC having:

a circulating store having a plurality of sequential locations for temporarily delaying the samples a predetermined amount in accordance with commands received from the processing means, and a fixed store having independently addressable locations for storing the samples for playback, the independently addressable locations being selectively addressable by the processing means;

a digital-to-analog converter (DAC) for receiving the samples from the two function memory and converting them to analog output signals;

output means under the control of the processing means for selectively combining the audio input signals and the output of the DAC to achieve time delay effects.

17. A combined audio processor and sampler as defined in claim 16 wherein the processing means includes a microprocessor and a memory control module responsive to the microprocessor for controlling the two function memory.

18. A combined audio processor and sampler as defined in claim 16 wherein the digitally controllable modulation means comprises:

a variable waveform generator coupled to the processing means for generating variable waveforms which sweep the sample clock associated with the ADC thereby causing the sample clock to vary the ADC rate wherein differences between the ADC rate and the rate at which the DAC converts the digital signals received from the two function memory into the analog output signals shifts the pitch of the analog output signals relative to the audio input signals.

19. A combined audio processor and sampler as defined in claim 16 wherein the audio input comprises:

an audio user interface for providing the audio input signals; and, a digitally controlled low pass filter for filtering the audio input signals received from the audio user interface and outputting the filtered signals to the ADC wherein the digitally controlled low pass filter has a cut off frequency set by the processing means.

20. A combined audio processor and sampler as defined in claim 16 wherein the output means comprises:

a digitally controlled mixer coupled to the DAC and to the analog input for selectively combining the analog output signals received from the DAC with the audio input signals received from the audio input wherein the analog output signal can be time delayed and pitch shifted with respect to the audio input signal to achieve time delay effects.

21. A combined audio processor and sampler as defined in claim 20 wherein the output means further comprises:

a digitally controlled low pass output filter for filtering the analog output signals received from the DAC and outputting the filtered signals to the digitally controlled mixer for selective combining with the audio input signals wherein the digitally controlled low pass filter has a cut off frequency set by the processing means.

22. A combined audio processor and sampler as defined in claim 20 further comprising:

a digitally activated feedback means coupled between the DAC and the mixer which selectively returns samples read out of the fixed store to the input means for audio processing.

23. A combined audio processor and sampler as defined in claim 22 wherein the digitally activated feedback means comprises:

a digitally activated switch connected between the DAC and the mixer; and, a feedback circuit connected between the digital switch and the audio input wherein the digital switch outputs the analog output signals received from the DAC to the audio input through the feedback circuit in one state and to the mixer in another state.

* * * * *